(12) United States Patent
Xu

(10) Patent No.: US 7,639,497 B2
(45) Date of Patent: Dec. 29, 2009

(54) HEAT DISSIPATION DEVICE HAVING A FAN MOUNTED THEREON

(75) Inventor: Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 43 days.

(21) Appl. No.: 11/953,722

(22) Filed: Dec. 10, 2007

(65) Prior Publication Data
US 2009/0147475 A1   Jun. 11, 2009

(51) Int. Cl.
*H05K 7/20* (2006.01)
*G06F 1/20* (2006.01)

(52) U.S. Cl. ............. 361/697; 361/697.47; 361/679.48; 361/679.54; 361/695; 361/704; 361/709; 165/80.3; 165/185; 174/16.1; 174/16.3; 248/510; 415/213.1

(58) Field of Classification Search ............ 361/679.48, 361/679.54, 690, 694–695, 697, 703–704, 361/719; 165/80.3, 185; 174/16.1, 16.3; 248/510; 24/453, 457–458; 415/213.1
See application file for complete search history.

(56) References Cited

U.S. PATENT DOCUMENTS

| 5,509,465 A | * | 4/1996 | Lai ............................. 165/80.3 |
| 5,678,627 A | * | 10/1997 | Lee ............................. 165/80.3 |
| 6,308,773 B2 | * | 10/2001 | Lin ............................. 165/80.3 |
| 6,435,467 B1 | * | 8/2002 | Lai ............................. 248/500 |
| 6,460,609 B1 | * | 10/2002 | Cho et al. .................. 165/80.3 |
| 6,579,062 B2 | * | 6/2003 | Lu et al. .................. 415/213.1 |
| 6,598,666 B2 | * | 7/2003 | Lin ............................. 165/80.3 |
| 6,654,246 B2 | * | 11/2003 | Wu ............................. 361/697 |
| 6,749,398 B2 | * | 6/2004 | Lu et al. .................. 415/121.2 |
| 6,865,079 B2 | * | 3/2005 | Yu ............................. 361/697 |
| 7,301,769 B2 | * | 11/2007 | Li et al. ...................... 361/697 |
| D567,772 S | * | 4/2008 | Lin et al. .................. D13/179 |
| 7,365,975 B2 | * | 4/2008 | Xia et al. ..................... 361/695 |
| 7,423,873 B2 | * | 9/2008 | Shuai et al. ................. 361/697 |
| 2002/0075653 A1 | * | 6/2002 | Lin ............................. 361/703 |
| 2004/0000398 A1 | * | 1/2004 | Lee et al. ..................... 165/185 |

FOREIGN PATENT DOCUMENTS

CN   201064045 Y   *   5/2008
KR   2003033422 A   *   5/2003

* cited by examiner

*Primary Examiner*—Jayprakash N Gandhi
*Assistant Examiner*—Robert Hoffberg
(74) *Attorney, Agent, or Firm*—Frank R. Niranjan

(57) ABSTRACT

A heat dissipation device for dissipating heat from a heat-generating electronic element includes a heat sink for contacting with the heat-generating electronic element, a fan placed on the heat sink for providing an airflow through the heat sink and two wire clips. The fan comprises a frame. Each wire clip comprises a V-shaped main body and two locking parts at two opposite ends of the main body. Middles of the main bodies of the two wire clips are securely attached to two lateral sides of the heat sink by two screws. The locking parts of the wire clips are fastened to the frame of the fan, with the main bodies being deformed and pushing the fan toward the heat sink.

15 Claims, 3 Drawing Sheets

HEAT DISSIPATION DEVICE HAVING A FAN MOUNTED THEREON

BACKGROUND OF THE INVENTION

1. Field of the Invention

The present invention relates generally to a heat dissipation device, and more particularly to a heat dissipation device having a heat sink and a fan holder for facilitating mounting of a fan on the heat sink.

2. Description of Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

When installing the fan to the heat sink, it is generally to fix the fan to a side of the heat sink via a fan holder with screws. Although using the screws can achieve the fastening objective, it requires a lot of manpower and material resource. Furthermore, it is necessary to remove the fan first by unscrewing the screws when disassembling and maintaining the heat dissipation device. Such unscrewing operation is tiresome for a user. In addition, it is also possible that the unscrewed screws may fall into a computer in which the heat dissipation device is mounted to cause damages to components of the computer.

What is need therefore is a heat dissipation device having a design which makes assembling and disassembling of a fan to/from a heat sink of the heat dissipation device be convenient and easy.

SUMMARY OF THE INVENTION

The present invention relates to a heat dissipation device for dissipating heat from a heat-generating electronic element. The heat dissipation device includes a heat sink to be kept in contact with the heat-generating electronic element, a fan placed on the heat sink for providing an airflow for the heat sink and two wire clips. The fan comprises a frame. The wire clip comprises a V-shaped main body and two locking parts at two opposite ends of the main body. Middles of the main bodies of the two wire clips are securely attached to two lateral sides of the heat sink by two screws threadedly engaging with the heat sink. The locking parts of the wire clips are fastened to the frame of the fan with the main bodies of the wire clips being deformed and pressing the fan toward the heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
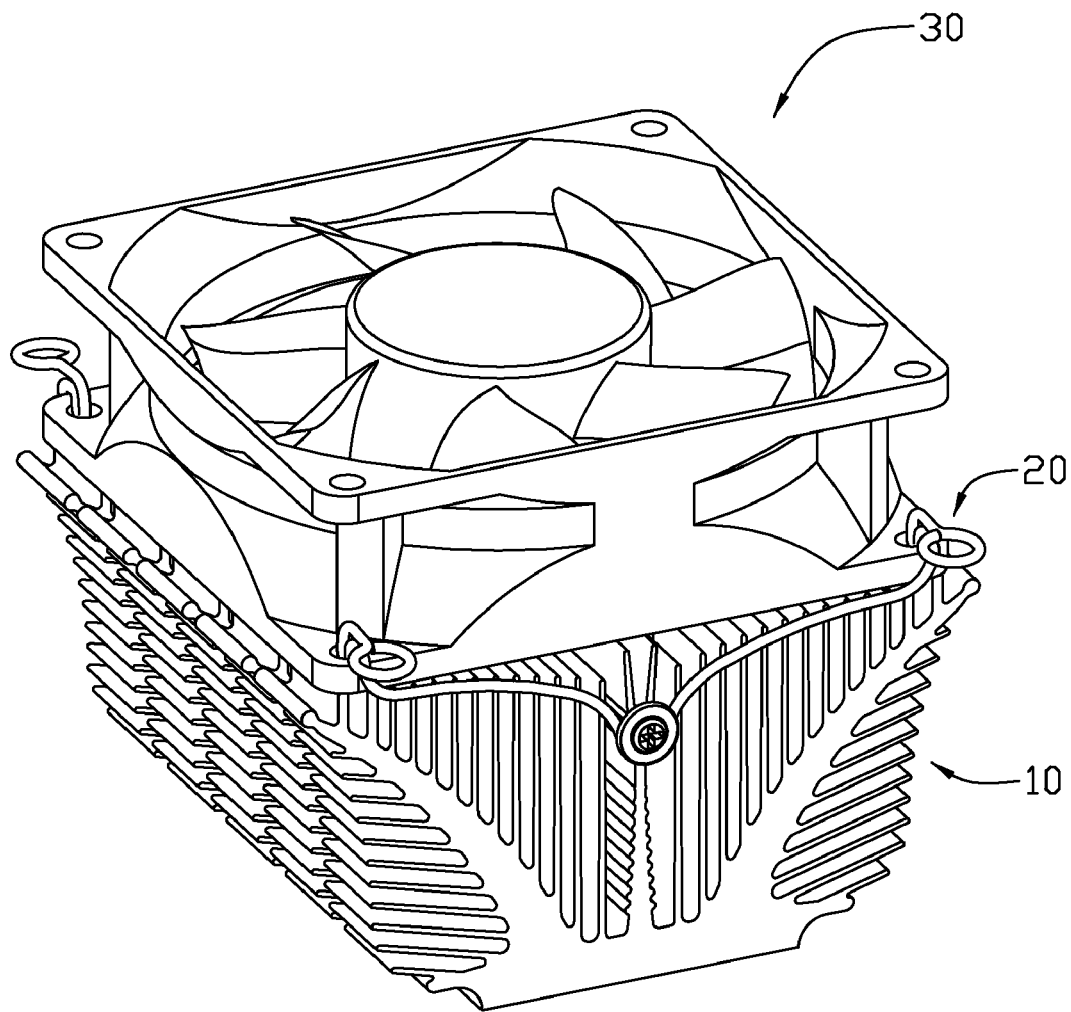
FIG. 1 is an assembled view of a heat dissipation device in accordance with a preferred embodiment of the present invention.
Figure 2:
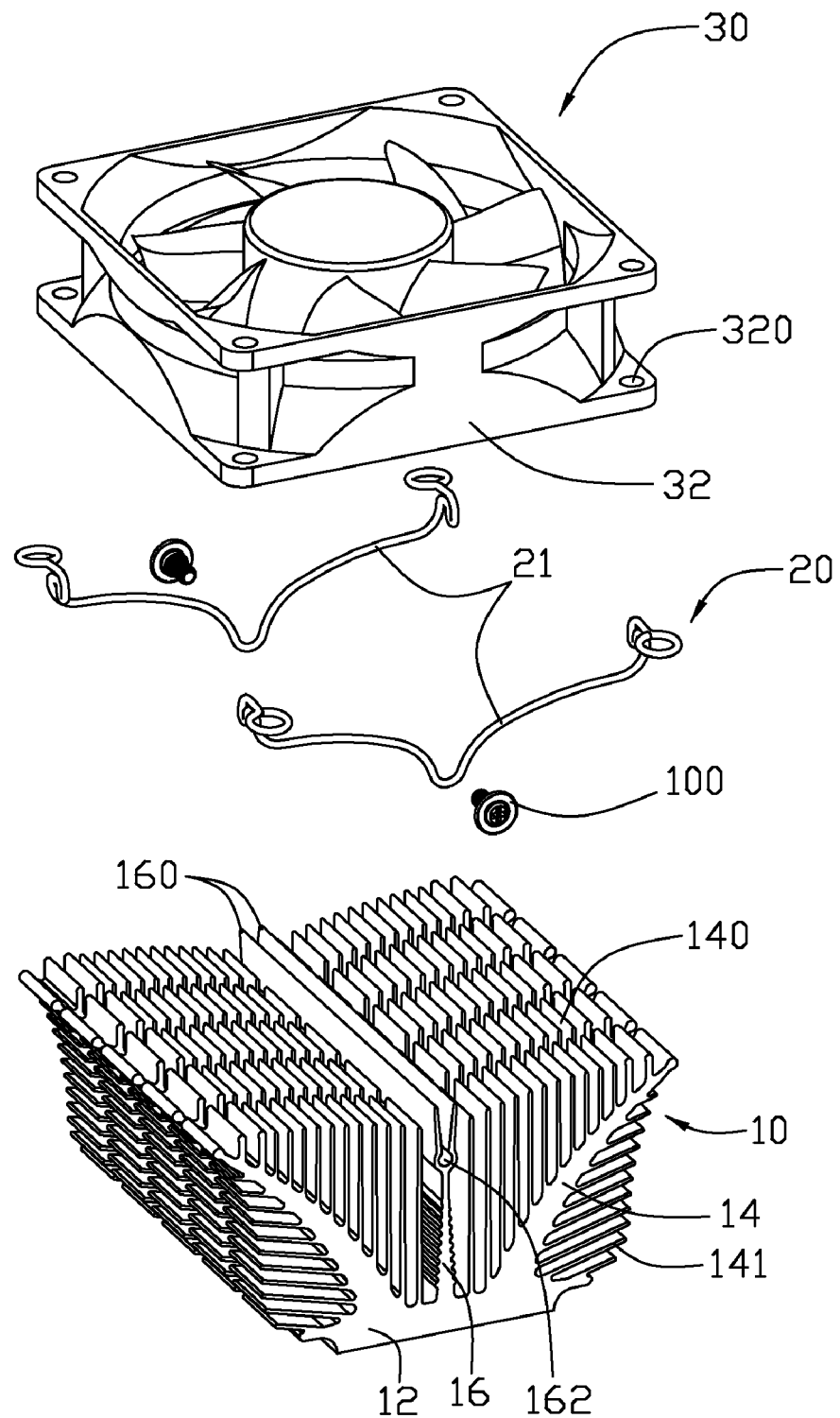
FIG. 2 is an exploded, isometric view of FIG. 1.
Figure 3:
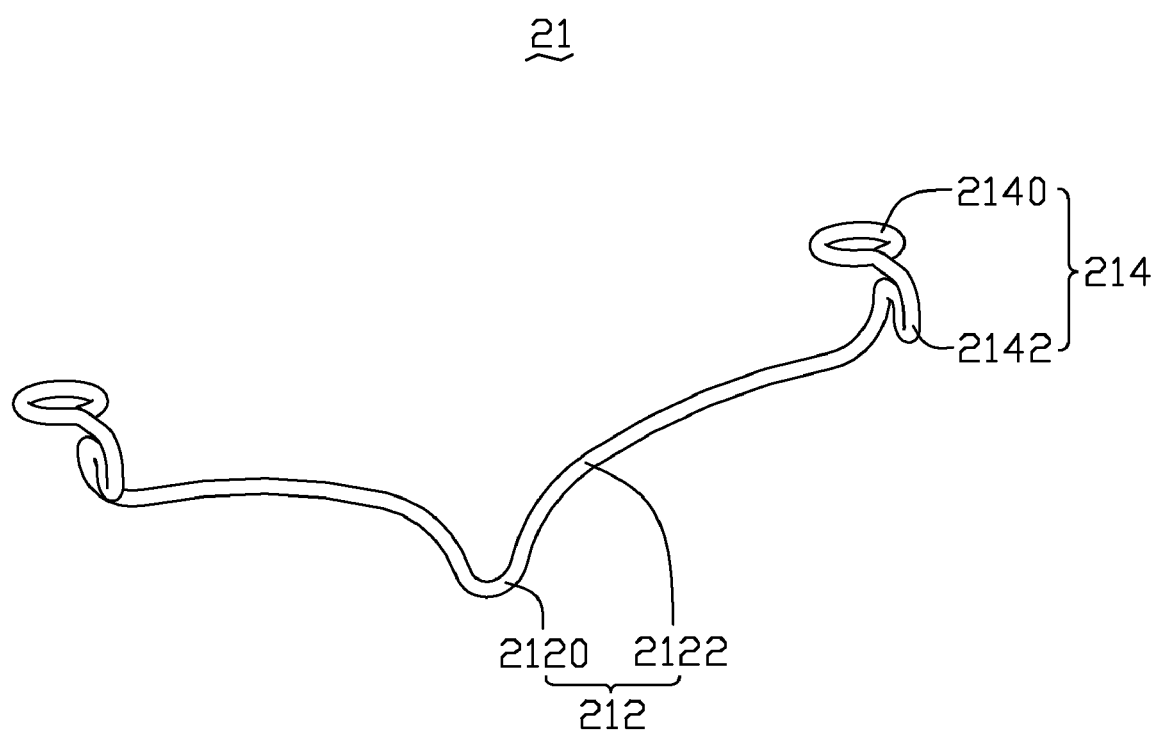
FIG. 3 is an enlarged view of a wire clip of a fan holder of the heat dissipation device of FIG. 2.

Referring to FIGS. 1-3, a heat dissipation device in accordance with a preferred embodiment of the present invention is shown. The heat dissipation device is mounted to a heat-generating electronic element (not shown), to dissipate heat from the heat-generating electronic element. The heat dissipation device comprises a heat sink 10, a fan holder 20 secured at two opposite lateral sides of the heat sink 10 and a fan 30 mounted on the heat sink 10 via the fan holder 20.

The heat sink 10 is integrally formed by aluminum extrusion. The heat sink 10 comprises a rectangular base plate 12 thermally in contact with the heat-generating electronic element, two arched conducting arms 14 extending obliquely from the base plate 12 and a central fin 16 extending perpendicularly from a middle of the base plate 12. The two conducting arms 14 are located at two lateral sides of the central fin 16 and spaced from the central fin 16. Each of the conducting arms 14 extends upwardly, obliquely from the base plate 12 and away from the central fin 16. Each of the conducting arms 14 forms a plurality of first fins 140 extending upwardly and vertically from an inner surface thereof, and a plurality of second fins 141 extending outwardly and horizontally from an outer surface thereof. The central fin 16 forms a pair of bifurcations 160 at a distal end thereof. Two fixing holes 162 are formed at two lateral sides of a joint of the central fin 16 and the bifurcations 160 for engaging with two fixing members to secure the fan holder 20 to the heat sink 10. In this embodiment, the fixing members are screws 100 each having a circular head (not labeled) and an elongated threaded shaft (not labeled) having a diameter much smaller than that of the head.

As shown in FIG. 3, the fan holder 20 includes two identical wire clips 21. The wire clip 21 is made by bending a single piece of spring wire, and comprises a main body 212 and two locking parts 214 at two opposite ends of the main body 212. The main body 212 is substantially V-shaped and comprises an inhibiting portion 2120 at a middle thereof and two elastic arms 2122 curve upwardly and away from two opposite ends of the inhibiting portion 2120. The inhibiting portion 2120 is substantially a semicircle in shape and configuration and defines an upwards opened recess (not labeled) for allowing the shaft of the screw 100 to extend therethrough until the head of the screw 100 abuts against an outer side of the inhibiting portion 2120. The locking parts 214 at the two ends of the main body 212 extend toward a lateral side of the wire clip 21. Each locking part 214 comprises an inserting portion 2142 for engaging with the fan 30 and an operating handle 2140 for operating the locking part 214. The inserting portion 2142 is a projection projecting downwardly and perpendicular to the heat sink 10 and the fan 30 when the heat sink 10, the fan 30 and the fan holder 20 are assembled together. The inserting portion 2142 is formed by bending one end of the main body 212 downwardly and then upwardly, whereby the inserting portion 2142 has a rounded bottom end (not labeled). The operating handle 2140 is extended at a plane perpendicular to that of the inserting portion 2142 and has a ring-shaped configuration formed by bending a distal end of the wire clip 21 after forming the inserting portion 2140. The operating handle 2140 is formed by bending the distal end of the wire clip 21 horizontally, wherein the operating handle 2140 and the inserting portion 2142 are located at two opposite lateral sides of the main body 212, respectively. The operating handle 2140 is located at a level above the inserting portion 2142.

The fan 30 has a frame 32 with a shape and size corresponding to that of a top of the heat sink 10. The frame 32 defines a plurality of through orifices 32 in corners thereof, for engagingly receiving the inserting portions 2142 of the wire clips 21.

Referring to FIG. 1 again, in assembly of the heat dissipation device, the fan 30 is placed on the heat sink 10. The two inhibiting portions 2120 of the main bodies 212 of the two wire clips 21 are attached to the two lateral sides of the heat sink 10 by being securely sandwiched between the heads of the screws 100 and the two lateral sides of the heat sink 10, wherein the shafts of the screws 100 are screwed into the fixing holes 162 of the heat sink 10. The heads of the screws 100 press the inhibiting portions 2120 of the wire clips 21 toward the lateral sides of the heat sink 10. The two locking parts 214 of each of the wire clips 21 are successively lifted to reach the corresponding corners of the frame 32 of the fan 30, with the inserting portions 2142 thereof being inserted into the corresponding fixing orifices 320 of the fan 30 by moving the operating handles 2140 of the locking parts 214 upwardly to the frame 320 of the fan 30. In this time, the main bodies 212 of the wire clips 21 are in a tensile deformation and the locking parts 214 of the wire clips 21 depress the corners of the frame 32 of the fan 30 toward the heat sink 10. The inhibiting portions 2120 are secured in position by the screws 100 that are screwed into the fixing holes 162 of the heat sink 10; thus, the fan 30 is securely mounted on the heat sink 10 by the wire clips 21. To release the locking of the fan 30 from the heat sink 10, a user only needs to move the operating handles 2140 upwardly to pull the insertion portions 2142 upwardly until they escape from the fixing orifices 320.

It can be easily understood, in some embodiment, the heat sink is not restricted to be definite configuration. The heat sink can be any other types in case the heat sink is capable to placidly support the fan 30 thereon and provided with two fixing holes for threadedly receiving the screws 100 at two lateral sides of the heat sink.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat from a heat-generating electronic element, comprising:
  a heat sink adapted for thermally contacting with the heat-generating electronic element;
  a fan placed on the heat sink for providing an airflow through the heat sink, the fan comprising a frame; and
  two wire clips each comprising a V-shaped main body and two locking parts at two opposite ends of the main body;
  wherein middles of the main bodies of the two wire clips are attached to two lateral sides of the heat sink, the locking parts of the wire clips are fastened to the frame of the fan, and the main bodies are deformed and push the fan toward the heat sink; and
  wherein the locking parts each comprise an inserting portion projecting downwardly into the frame of the fan and an operating handle formed above the inserting portion.

2. The heat dissipation device of claim 1, wherein two fixing members are secured to the two lateral sides of the heat sink, and the middle portions of the main bodies of the two wire clips are respectively pressed by the two fixing members toward the heat sink.

3. The heat dissipation device of claim 2, wherein the main body comprises an inhibiting portion at a middle thereof and two elastic arms curved upwardly and oppositely from two opposite ends of the inhibiting portion.

4. The heat dissipation device of claim 3, wherein the inhibiting portion is substantially a semicircle in shape and locked by a corresponding fixing member to the heat sink.

5. The heat dissipation device of claim 2, wherein the heat sink defines two fixing holes at the two lateral sides thereof, and the fixing members are two screws fixed in the fixing holes.

6. The heat dissipation device of claim 5, wherein the heat sink comprises a base plate, a central fin extending upwardly, perpendicularly from a middle of the base plate and two arched conducting arms extending obliquely from the base plate and away from the central fin.

7. The heat dissipation device of claim 6, wherein each of the conducting arms forms a plurality of first fins extending upwardly and vertically from an inner surface thereof and a plurality of second fins extending outwardly and horizontally from an outer surface thereof.

8. The heat dissipation device of claim 6, wherein the central fin forms a pair of bifurcations at a distal end thereof, and the two fixing holes are formed at two lateral sides of a joint of the central fin and the bifurcations.

9. The heat dissipation device of claim 1, wherein the frame of the fan defines four through orifices at four corners thereof, and the inserting portions are engaged into corresponding through orifices.

10. The heat dissipation device of claim 1, wherein the inserting portion and the operating handle are formed at two opposite sides of each of the locking parts, respectively.

11. The heat dissipation device of claim 1, wherein the operating handle is ring-shaped and perpendicular to the inserting portion.

12. A heat dissipation device comprising:
  a heat sink having a base adapted for thermally connecting with an electronic component and a plurality of fins on the base;
  a fan mounted on the fins, comprising a plurality of corners each defining a fixing orifice;
  at least a clip wire having a V-shaped main body and two locking parts formed at two opposite ends of the main body, respectively;
  at least a fastener securely attaching the V-shaped main body to the heat sink; wherein
  the two locking parts each have an inserting portion inserted into a corresponding fixing orifice whereby the at least a clip wire fastens the fan and the heat sink together;
  wherein the two locking parts each further have an operating handle for manipulating the each locking part. the operating handle having an annular configuration and extending at a plane perpendicular to that of the inserting portion.

13. The heat dissipation device of claim 12, wherein the operating handle and the inserting portion are located at two opposite sides of each of the locking parts.

14. The heat dissipation device of claim 13, wherein the operating handle is located above the inserting portion.

15. The heat dissipation device of claim 12, wherein the at least a fastener is a screw threadedly engaging in the fins of the heat sink.

* * * * *